(12) United States Patent
Knippels et al.

(10) Patent No.: US 9,592,574 B2
(45) Date of Patent: Mar. 14, 2017

(54) METHOD AND APPARATUS FOR SCRIBING A SUBSTANTIALLY PLANAR SEMICONDUCTOR SUBSTRATE WITH ON-THE-FLY CONTROL OF SCRIBING ALIGNMENT

(71) Applicant: Advanced Laser Separation International (ALSI) N.V., TL Beuningen (NL)

(72) Inventors: Guido Martinus Henricus Knippels, Schijndel (NL); Hans Peter Chall, Molenhoek (NL); Ivo Libertus Adrianus Maria Pullens, Veghel (NL); Garrit Willem Ubink, Arnhem (NL)

(73) Assignee: ASM TECHNOLOGY SINGAPORE PTE. LTD., Singapore (SG)

( * ) Notice: Subject to any disclaimer, the term of this patent is extended or adjusted under 35 U.S.C. 154(b) by 573 days.

(21) Appl. No.: 13/764,406

(22) Filed: Feb. 11, 2013

(65) Prior Publication Data

US 2013/0217153 A1 Aug. 22, 2013

(30) Foreign Application Priority Data

Feb. 18, 2012 (EP) .................................... 12001095

(51) Int. Cl.
*B23K 26/36* (2014.01)
*H01L 21/66* (2006.01)
(Continued)

(52) U.S. Cl.
CPC .......... *B23K 26/365* (2013.01); *B23K 26/083* (2013.01); *B23K 26/364* (2015.10);
(Continued)

(58) Field of Classification Search
CPC ....... H01L 21/67115; H01L 2924/0002; H01L 2924/00; H01L 31/022425; H01L 31/03921
(Continued)

(56) References Cited

U.S. PATENT DOCUMENTS 6,383,940 B1 5/2002 Yoshimura
6,791,057 B1 9/2004 Kratzsch et al.
(Continued)

FOREIGN PATENT DOCUMENTS

WO 97/29509 8/1997
WO 02/076699 A1 10/2002
(Continued)

OTHER PUBLICATIONS

U.S. Office Action dated Jan. 30, 2015 for U.S. Appl. No. 14/165,029.

*Primary Examiner* — David Vu
*Assistant Examiner* — Jonathan Han
(74) *Attorney, Agent, or Firm* — Pillsbury Winthrop Shaw Pittman

(57) ABSTRACT

A method of scribing a substrate along a scribeline includes causing a laser beam to impinge on the major surface, the point of impingement of the beam constituting a light spot, the substrate being positioned with respect to the laser beam such that the light spot is disposed proximal to the scribeline. The substrate and laser beam are moved relative to one another, such that the light spot is caused to translate substantially along the scribeline, whereby localized energy is transferred from the laser beam to the substrate along the course of the scribeline. The positioning of the light spot with respect to the scribeline is monitored by imaging a flash of light produced during the relative motion. Image recognition software is used to analyze the image and determine
(Continued)

momentary position information. The momentary position information is used to regulate a laser beam position setpoint.

7 Claims, 4 Drawing Sheets

(51) Int. Cl.
    *B23K 26/08*     (2014.01)
    *B23K 26/40*     (2014.01)
    *H01L 21/78*     (2006.01)

(52) U.S. Cl.
    CPC .............. *B23K 26/40* (2013.01); *H01L 22/10* (2013.01); *B23K 2203/50* (2015.10); *H01L 21/78* (2013.01)

(58) Field of Classification Search
    USPC ...................................... 438/635; 219/121.43
    See application file for complete search history.

(56) References Cited

U.S. PATENT DOCUMENTS

2009/0314751 A1* 12/2009 Manens et al. .......... 219/121.69
2009/0321399 A1   12/2009 Inagawa et al.
2010/0155379 A1*  6/2010 Shamoun ................. 219/121.68

FOREIGN PATENT DOCUMENTS

WO       2010/059595 A2   5/2010
WO       2011/017569 A2   2/2011

* cited by examiner

METHOD AND APPARATUS FOR SCRIBING A SUBSTANTIALLY PLANAR SEMICONDUCTOR SUBSTRATE WITH ON-THE-FLY CONTROL OF SCRIBING ALIGNMENT

FIELD OF THE INVENTION

This application claims priority to EP Application No. 12001095.4 filed Feb. 18, 2012 herein incorporated by reference in its entirety.

BACKGROUND OF THE INVENTION

The invention relates generally to scribing a semiconductor substrate and more particularly to methods and apparatus for scribing a semiconductor substrate using a laser.

A method of scribing a substantially planar substrate comprising semiconductor material along at least one scribeline by way of relative motion of the substrate with respect to a laser beam, whereby localized energy is transferred from the laser beam to the substrate along the course of said scribeline is set forth, for example, in WO 2002/076699 A1. Here, a single laser beam is used to create ablated tracts along scribelines arranged in an orthogonal grid structure on a major surface of a coated semiconductor wafer. Once this network has been created, a mechanical saw is used to singulate the substrate into dies by cutting along said tracts.

Another method of this type is set forth, for example, in International Patent Application WO 1997/029509 A1. In this document, a linear cluster of laser beams is used to ablate substrate material along a scribeline, thus causing the substrate to be "radiatively scored" along the line of ablation. The use of multiple beams in this manner as opposed to a single (more powerful) beam can help to produce a narrower ablation tract on the substrate. This can have certain advantages, particularly when the scribeline in question is in close proximity to (fragile and expensive) devices on a semiconductor substrate, for example.

BRIEF DESCRIPTION OF THE DRAWINGS

The invention will now be elucidated in more detail on the basis of particular embodiments and the accompanying schematic drawings, in which.

In the Figures, corresponding parts are indicated using corresponding reference symbols.

DETAILED DESCRIPTION

Figure 1:
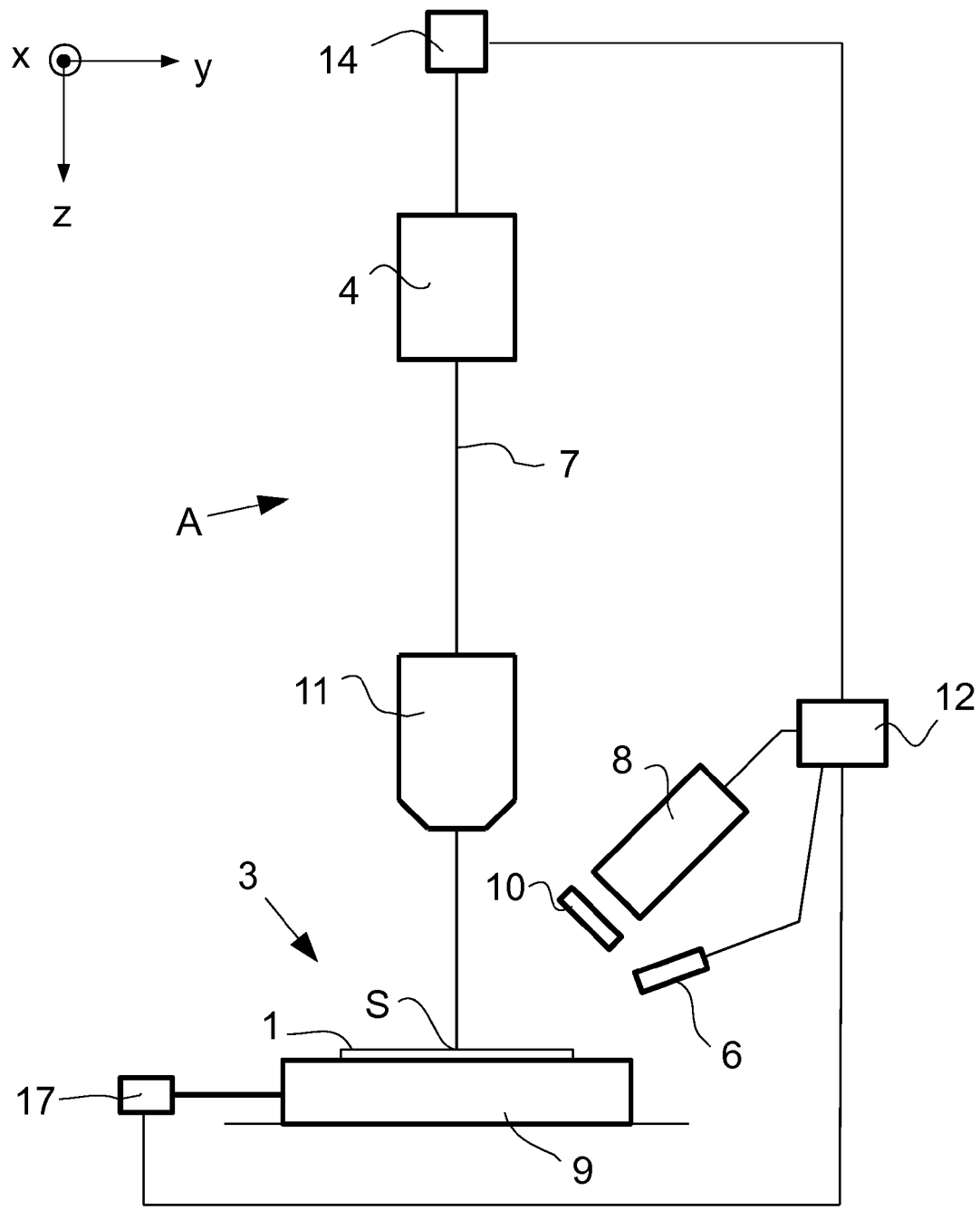
FIG. 1 renders an end view (along an X axis) of part of an apparatus suitable for performing a method according to the current invention.

For purposes of clarity and consistency, the following terms as used throughout this text and the appended claims should be interpreted as follows:

The phrase "substantially planar substrate" should be construed as referring to a substrate in the (approximate) form of a sheet, plate, leaf, wafer, platen, etc. Such a substrate will generally be (substantially) flat in form, and present two opposed major surfaces separated by a relatively thin intervening "sidewall".

The phrase "comprising semiconductor material" should be broadly interpreted as encompassing any substrate on which a semiconductor device or other integrated device is manufactured. Such substrates may, for example, comprise silicon or germanium wafers (of various diameters), and/or wafers of compound substances such as InAs, InSb, InP, GaSb, GaP or GaAs. The term also encompasses non-semiconductor materials (such as sapphire) on which one or more layers of semiconductor material have been deposited, e.g., as in the manufacture of LEDs. The semiconductor device or other integrated device concerned may, for example, be an integrated circuit, (passive) electronic component, opto-electronic component, biological chip, MEMS device, etc. Such devices will generally be manufactured in large numbers on a given substrate, and will typically be laid out in a matrix arrangement on at least one of said major surfaces.

The term "scribeline" (also sometimes referred to as a "scribelane") should be interpreted as referring to a (real or abstract) line extending along a major surface of a substrate, along which line the substrate is to be scribed. The term "scribing" as used in this context encompasses processes such as scoring, cutting, kerfing, severing, cleaving, furrowing, gouging and grooving. In the specific case of a semiconductor substrate, a scribeline will generally lie in a "street" that extends between neighboring rows of integrated devices on the substrate, along which street the substrate is to be "diced" so as to allow (ultimate) separation of the devices in question. Such a procedure is often referred to as "singulation". It should be explicitly noted that such a singulation procedure may be single-step (in which the substrate is cut/severed through its full depth in a single operation) or multi-step (in which a first scribe does not cause the substrate to be severed through its full depth, and one or more follow-up procedures are used to finish off the severing process, such as additional radiative scribing, mechanical scribing/cutting, etc.). The employed laser beam(s) in the current context may be focused onto said major surface of the substrate, or may be caused to focus beneath said surface, if so desired. Such a sub-surface approach can help to reduce contamination issues, for example, by causing ablation debris to be confined within the bulk/lattice of the substrate material, rather than have them alight onto surfaces of the substrate. Even if a laser beam has a focal point beneath a surface, it will still demonstrate a light spot at the point where it impinges upon said surface.

To ensure accurate scribing of the substrate along an intended scribeline, it will generally be necessary to frequently/continually monitor the position of the light spot with respect to the scribeline, since drift in the relative position of light spot and scribeline can have very undesirable consequences, such as damage to integrated devices bordering on the scribeline, over-sized post-singulation dies, wrong singulated die shape, etc. One way to effect such monitoring would be to regularly halt the scribing process, examine the path traced out by the light spot up to that point and compare it to the intended scribeline course, determine any unwanted deviation between the two, and then re-adjust the position of the laser beam with respect to the substrate as/if required. However, such an approach may tend to cause a decrease in throughput, which—particularly in the case of the capital-intensive semiconductor industry—can lead to an unacceptable increase in production costs.

In accordance with an embodiment of the invention, a laser scribing method includes monitoring a position of a light spot with respect to the scribeline using a method that includes illuminating at least a portion of the major surface proximal to the light spot using a flash of light, produced during said relative motion, during said illumination, using an image recording device to capture an image of said portion, including said light spot, using image recognition software to analyze said image and to determine momentary position information for the light spot relative to the scribeline, and using said momentary position information to regulate a setpoint for a position of the laser beam relative to the substrate. As will be appreciated, relative motion of the light spot and the substrate may be effected by motion of the light spot (i.e., a change in an aim point of the laser), motion of the substrate, or a combination of the two.

The illuminating flash of light referred to here can, for example, be produced with the aid of a stroboscope (e.g., using a pulsed Light Emitting Diode, LED). The specified image recording device can be a video camera or still camera, for instance, and will ideally directly produce a digital image that lends itself to processing using said image recognition software; alternatively, a digitized analog image is also conceivable.

This method according to an embodiment may allow for on-the-fly monitoring without the need to interrupt the scribing process. It may also allow the actual position of the light spot to be visualized in real time, as opposed to a having to infer the last position of the light spot on the basis of the path that it has traced out up to that point. Since the light spot is relatively bright with respect to the substrate surface, it stands out easily in the captured image, a fact that lends itself to accurate location and positional measurement; on the other hand, the path traced out by the light spot will typically not demonstrate such a brightness difference relative to the underlying substrate surface, which would tend to hamper the use of image recognition software in the prior-art approach, since it would be more difficult for such software to perform the desired localization and analysis operations in such a scenario.

In the event that the employed laser beam is pulsed, the image referred to above should be (at least partially) captured during a radiating pulse of the laser beam, in order to ensure that said image includes the light spot, as desired. Performing image capture purely between radiating pulses would fail to record the light spot (whence the spot-specific advantages alluded to in the previous paragraph would be missed).

In a particular embodiment, the flash of light may include a wavelength different to that of the laser beam and the image recording device may be provided with a filter that substantially attenuates the wavelength of the laser beam but substantially transmits said wavelength of the flash of light, at least in reflection from the substrate.

These measures are aimed at ensuring that the image recording device is not over-saturated by the relatively bright light spot. Said attenuation serves to reduce the observed brightness of the light spot to a level whereby it will not "drown out" the background substrate surface against which it is observed. It should be noted that the qualification "at least in reflection from the substrate" caters to the possibility that the substrate may absorb some component wavelength(s) of a (non-monochromatic) flash of light, whence at least (a portion of) the non-absorbed components reflected/scattered from the substrate should not be hindered by the employed filter.

In another aspect of the method according to the invention, the image recording device registers a location of the light spot with the aid of a localized glow generated by energetic (actinic) interaction of the laser beam with at least one of: a material of the substrate, or a fluid (e.g., gas, liquid, plasma) present at the location of the light spot.

Such a glow may, for example, be due to fluorescence in a laser-induced plasma at the location of the light spot. Alternatively and/or supplementarily, the glow may be some form of incandescence of the substrate material due to localized heating thereof by the light spot. In yet another possible scenario, the glow may be due to wavelength conversion effects, whereby incoming photons in the laser beam (associated with the light spot) generate electron-hole pairs when they impinge on the semiconductor material, with subsequent release of energy in the form of luminescence (glow) upon recombination of these electron-hole pairs. Capture of the light spot by the image recording device may thus entail direct capture (e.g., due to scattering of laser light from the substrate upon impingement) and/or indirect capture (via the glow referred to here). The glow referred to here will generally be free of so-called "speckle"—which is caused by coherence effects in laser beams, and can cause a laser spot to have a mottled/speckled appearance, which may be confusing to image recognition hardware/software; this aspect of said glow makes it attractive as a "marker" to define the light spot position.

In a particular embodiment of a method according to the present invention, said filter transmits at least a portion of light from said glow. Naturally, if the glow can be used to (help) register the position of the light spot, then it makes sense for the employed filter to be tailored in such a manner as to allow the glow to (at least partially) pass to the associated image recording device.

In an embodiment, the laser beam may be one member of a cluster of laser beams, all caused to concurrently impinge on the substrate at least proximal to said scribeline and the light spot is (at least) one member of a corresponding cluster of light spots associated with said cluster of laser beams.

In an embodiment, the image recording device is configured and arranged to simultaneously capture an image of both the light spot and a portion of the major surface proximal thereto (e.g., directly surrounding it). In this embodiment, it does not capture these images in an interleaved manner, e.g., using a closed shutter to blank out the light spot when the substrate surface is being imaged and then opening said shutter so as to image the light spot. It may also use an image recording device (camera, CCD array) to image both light spot and substrate surface, rather than using a device such as a photodiode or quad cell, for example; having an image of both light spot and surface may simplify the application of image recognition software.

Determining momentary position information for the light spot relative to the scribeline may be direct or relative. For example, the positions of both light spot and scribeline may be determined relative to an (external) elected reference, and their relative position subsequently determined by appropriate (vectorial) subtraction of said positions.

Another point that needs to be stressed is that the aforementioned image recording device may be of an "on-axis" or "off-axis" type. In an on-axis set-up, the image recording device looks along the optical axis (propagation line) of the employed laser beam, i.e., the line of sight of the image recording device and the optical axis of the laser beam are substantially coincident. On the other hand, in an off-axis set-up, the image recording device has a line of sight that subtends a non-zero angle with the optical axis of the laser beam (e.g., as depicted in FIG. 1).

As regards the image recognition software employed by the present invention, the skilled artisan will be familiar with such software and its use. Image recognition algorithms may, for example, work by seeking cross-correlation with a given manually "programmed" reference image, or by performing template matching to a previously selected template. There are various commercially available software packages for this purpose.

In an embodiment of a method according to the present invention—which is not intended to be in any way limiting upon the scope of the invention but is merely presented here for the purpose of giving concrete, practical examples—the following aspects apply:

An input laser beam is selected to have a wavelength in the range 200-3000 nm and an output power in the range 1 mW-100 W. The chosen laser will depend largely on the material of the substrate being scribed. Wavelengths in this range can be produced by a variety of lasers. For example, a solid-state Nd:YAG laser produces a wavelength of 1064 nm, with harmonics at 532 nm and 355 nm. Alternatively, one can use, for example a doped fiber laser with a wavelength of 1062 nm. Said 355 nm wavelength is particularly attractive because:

It tends to be strongly absorbed by semiconductor materials;

It can generally be focused relatively easily to a relatively small spot size.

However, this is purely a matter of choice, and other wavelengths can alternatively be employed.

The input laser is pulsed, with a pulse duration in the range of about 1 Microsecond—100 femtoseconds.

Using a Diffractive Optical Element (DOE), the input laser is divided so as to form a beam cluster having 2-20 members. This step is optional, and one can instead elect to use a single/non-divided scribing beam. When one elects to divide the input laser, the separation of adjacent focal points can, for example, be chosen to lie in the approximate range 5-500 µm, e.g., about 50-70 µm. It should be noted that the beam cluster thus produced does not have to be linear (1-dimensional) in form; one could instead elect to produce a 2-dimensional cluster, e.g., in the form of a rectangle of n spots×m spots (n and m being integers).

If it is elected to focus the laser beam(s) into the substrate bulk rather than onto its major surface, then the depth(s) of the focal point(s) of the laser beam(s) below the major surface is/are chosen to lie in the range 20-700 µm.

The flash of light used in the inventive method may, for example, be produced by a LED, such as a 5-Watt 405-nm LED (e.g., type LZ1-OOUA05 supplied by Led Engin Inc., San Jose, Calif., USA).

One may elect to use a filter as set forth above. For example, when used in combination with a 355-nm laser beam and 405-nm LED (see above), such a filter might be a 5-nm broad bandpass filter with a transmission >80% at 405±2.5nm and strong attenuation (e.g., Optical Density >6) at 355 nm.

Embodiment 1

FIG. 1 renders an end view of part of an apparatus A suitable for conducting the method according to the current invention, i.e., for scribing a substantially planar semiconductor substrate 1 along at least one scribeline 2 (not depicted; see FIG. 2) parallel to a major surface 3 of the substrate. On the other hand, FIG. 2 renders a plan view of an aspect of the lower portion of FIG. 1. Note the Cartesian coordinate system X,Y,Z shown in the figures.

Figure 2:
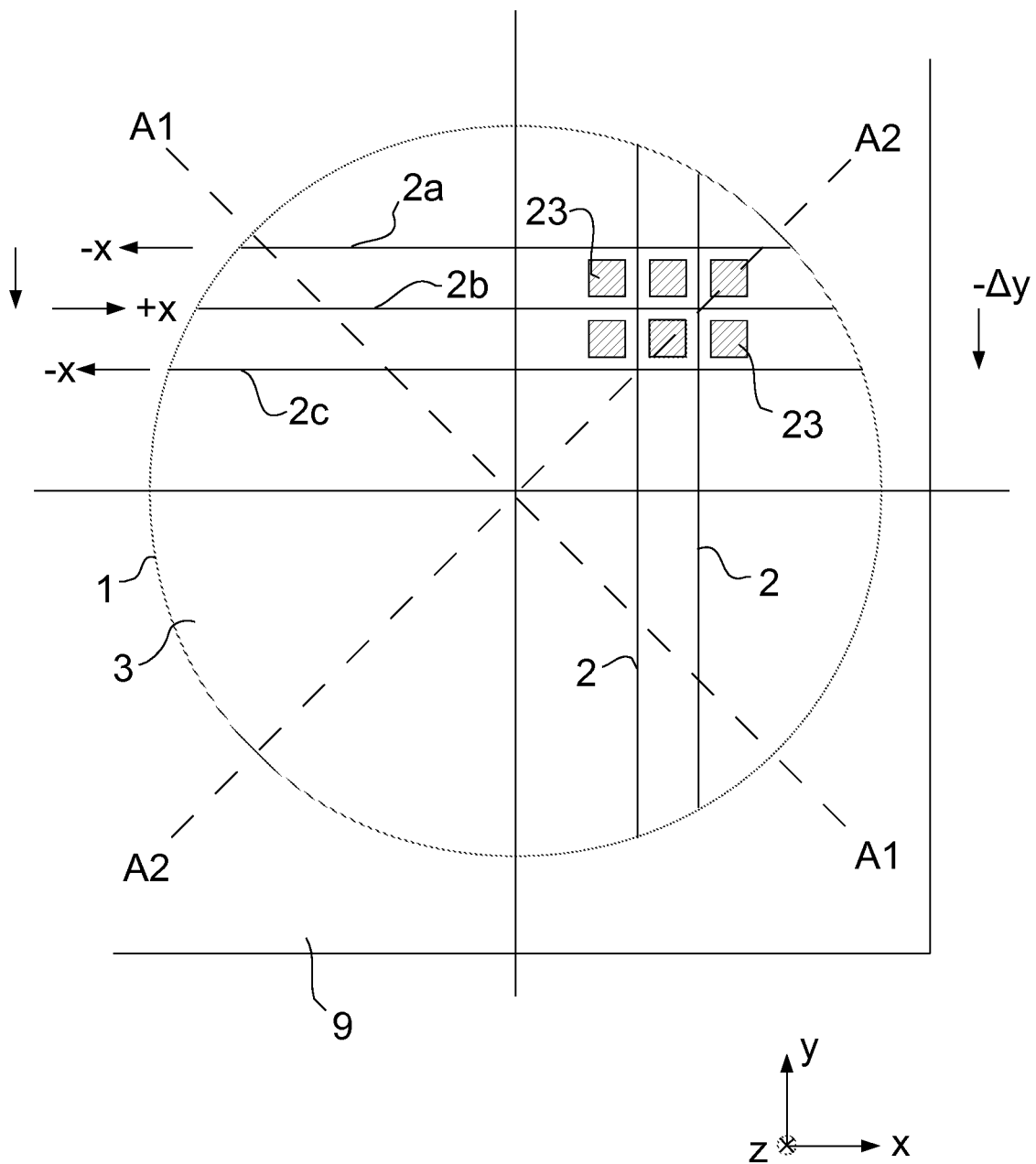
FIG. 2 renders a plan view (along a Z axis) of part of the subject of FIG. 1, in particular a lower portion of FIG. 1.

Specifically, FIGS. 1 and 2 collectively show the following:

A pulsed laser source 4, which outputs a pulsed laser beam 7. The laser source 4 is connected to a controller 14 that can be used inter alia to control parameters such as the pulse duration and power/fluence of the beam 7.

A substrate table 9, onto which the substrate 1 is mounted to as to present the major surface 3 to the laser source 4. Such mounting conventionally occurs via peripheral clamping, for example.

A projection (i.e., imaging) system 11, for projecting the laser beam 7 upon the substrate 1. At the point of impingement of the beam 7 upon the substrate 1, a light spot S is formed. The projection system 11 may be used to focus the beam 7 onto or into the substrate 1, as desired, and may also perform aberration/distortion correction, for example.

A stage assembly 17, which can position the substrate table 9 relative to the beam 7, in the XY plane.

FIG. 2 shows the substrate 1 viewed from above, as it rests upon the substrate table 9. Upon the major surface 3, various scribelines 2 are illustrated. These scribelines 2 run in an X/Y grid pattern between integrated devices 23 that are distributed in a matrix arrangement on the surface 3; there will generally be very many such devices 23 on a typical semiconductor substrate, but only a few have been illustrated here, so as not to clutter the drawing.

The Figure depicts a "longitudinal scan and lateral step" approach to scribing the substrate 1 along multiple, successive scribelines 2 in a particular direction (in this case ±X). For example:

The substrate 1 is scribed along scribeline 2a by scanning the beam 7 in the −X direction; in practice, this relative motion can actually be achieved by using the stage assembly 17 (see FIG. 1) to scan the substrate table 9 in the +X direction.

After completing the scribing run along scribeline 2a, the stage assembly 17 will be used to step the substrate table 9 in the +Y direction by an amount ΔY; as a result, the beam 7 will effectively be stepped with respect to the substrate surface 3 by an amount −ΔY.

The substrate 1 is now scribed along scribeline 2b by scanning the beam 7 in the +X direction; in practice, this relative motion can be achieved by using the stage assembly 17 to scan the substrate table 9 in the −X direction.

And so forth.

It should be noted that there are various ways of embodying the stage assembly 17, and the skilled artisan will be able to implement many alternatives in this regard. One particular embodiment, which is schematically depicted in FIG. 2, uses two separate linear motors (not depicted) to independently drive the substrate table 9 along axes A1 and A2, which subtend angles of 45° with the X,Y axes; motion in X or Y then involves concurrent driving along the A1 and A2 axes. Typically, the substrate table 9 will be caused to float smoothly over a reference surface (such as a polished stone surface) in the XY plane, e.g., with the aid of an air bearing or magnetic bearing (not depicted). The exact position of the substrate table 9 can be monitored and controlled with the aid of positioning instruments such as interferometers or linear encoders, for example (not depicted). In particular, focus control/level sensing (not depicted) will also typically be employed, to ensure that the surface 3 of the substrate 1 is maintained at a desired level with respect to the projection system 11. All such conventional positioning and control aspects will be very familiar to the skilled artisan, and do not require any further elucidation here.

The skilled artisan will also appreciate that, conventionally, substrates that are to undergo scribing are first mounted on a foil that is spanned within a circumferential frame, and that it is therefore the composite structure of substrate, foil and circumferential frame that will have to be mounted on the substrate table 9. Equally, the skilled artisan will appreciate that, after scribing an entire substrate, the substrate can be separated along the various scribelines by laterally stretching said foil, for example. These are such intrinsic aspects of the field of semiconductor substrate scribing that they do not require further elucidation here.

Returning now to FIG. 1, the apparatus A further comprises:

A stroboscopic light source 6, which can produce a flash of light upon command from a controller 12. Such a flash may, for example, have a duration of the order of about a microsecond, or shorter.

A digital camera (image recording device) 8, which can simultaneously capture an image of the light spot S and a portion of the major surface 3 surrounding the light spot S. This camera 8 is also connected to the controller 12, so that image capture can be synchronized to production of a light flash by source 6.

A filter 10, e.g., an appropriate interference filter. This filter 10 substantially (but not totally) attenuates the wavelength of the laser beam 7, but substantially transmits at least one wavelength of light produced by the source 6. In this way, the digital camera 8 can capture an image in which the location of the spot S is clearly visible against the background 3, without being over-saturated by excessive intensity from S. If desired, the filter 10 can also be embodied to pass light from a secondary glow (not depicted) generated at the location of S by energetic (actinic) interaction of the beam 7 with the substrate 1, e.g., fluorescence of locally generated plasma or localized incandescence/luminescence of the substrate (for instance due to heating and/or wavelength conversion effects).

Figure 3:
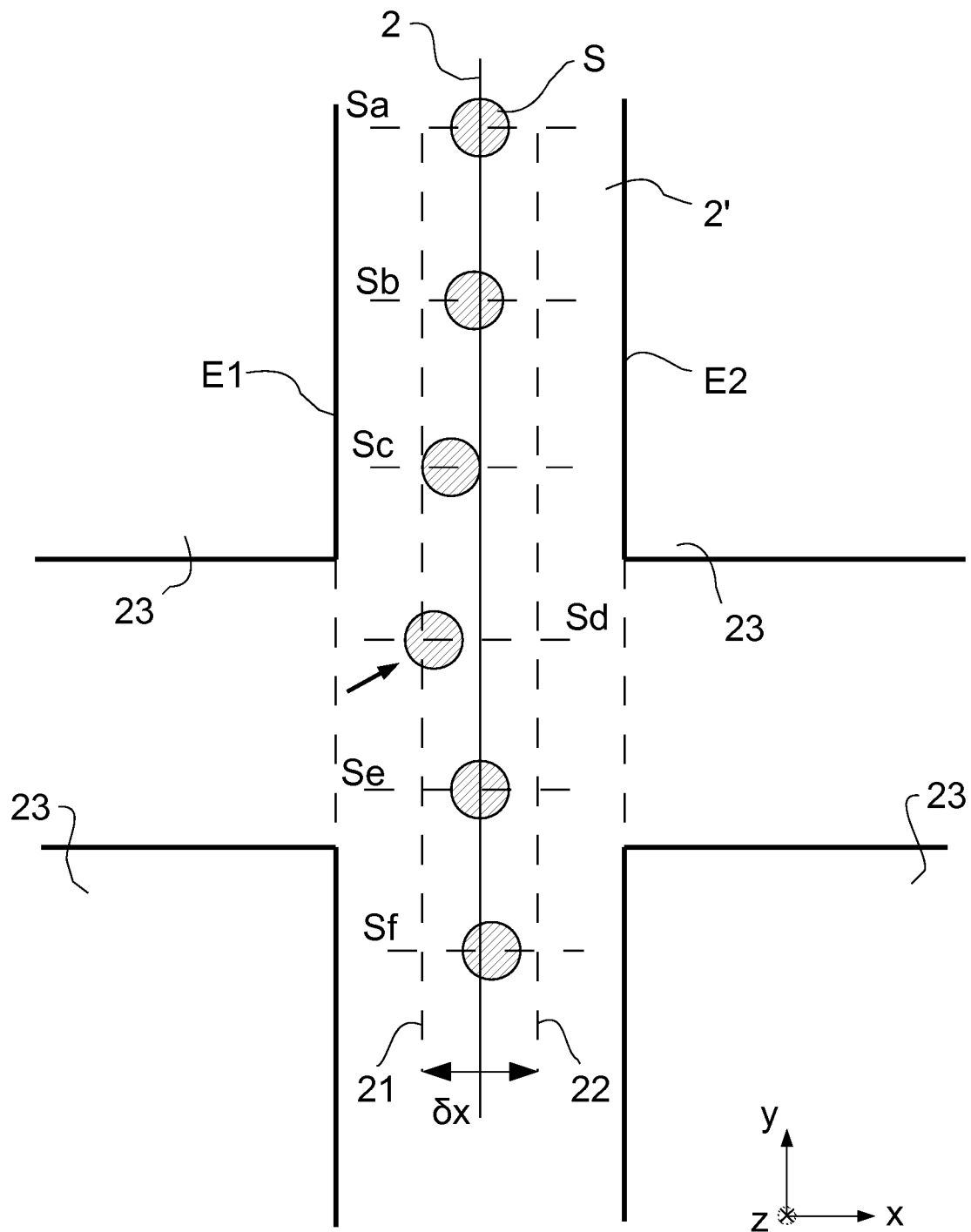
FIG. 3 shows part of the subject of FIG. 2, in greater detail.

It should be noted that, in the schematic illustration of FIG. 3, set-up 6, 8 is rendered in an "off-axis" configuration, so as not to clutter the drawing. However, the skilled artisan will appreciate that a suitable "on-axis" configuration can also be realized.

As here depicted, the controller 12 is connected to the laser controller 14, so that the timing of a flash from source 6 and an image capture by camera 8 can be synchronized with the firing of radiative pulses by the laser 4. In particular, said flash and image capture can be timed to occur during such a radiative pulse (rather than purely between such pulses). Alternatively, the flash/image capture can span several laser pulses (e.g., if the capture rate of the camera 8 is relatively low and the pulse rate of the laser 4 is relatively high). The controller 12 is also connected to the stage assembly 17, so that relative positioning of the substrate 1 and beam 7 can be regulated in response to automated analysis performed by the controller 12 upon imagery captured by the camera 8. This aspect of the invention will now be explained in more detail with reference to FIG. 3.

FIG. 3 renders a magnified view of part of the subject of FIG. 2. In particular, the Figure shows four devices 23 that are mutually separated by two dicing streets 2'. A desired scribeline 2 is shown running along one of these dicing streets 2', extending parallel to the Y-axis and centered within the dicing street 2' with respect to the X-direction. As here depicted, light spot S is moving relative to the substrate along the −Y direction, and its successive positions at regularly spaced time intervals are here denoted by the labels Sa, Sb, . . . , Sf.

In an ideal situation, the spot S would remain exactly centered upon a scribeline 2 during scanning. However, in reality, effects such as imperfections in the stage assembly 17, aberrations in the projection system 11, thermal distortion of the substrate 1, etc., will tend to cause the spot S to drift (wobble) off of the scribeline 2 in the course of a scan. A certain amount of drift will generally be acceptable, and this is illustrated in FIG. 3 using the two lines 21 and 22, which symmetrically flank the scribeline 2 and delimit an interposed region of allowed drift having an X-width ∂x. As long as the spot S remains within these two lines 21, 22, acceptable tolerances are considered to be met; however, if the spot S drifts outside either of the lines 21, 22, allowable tolerances are considered to be violated. The invention provides a means of monitoring and correcting such tolerance violations.

The position of the spot S with respect to the landscape 23, 2' is periodically captured during laser pulses using the set-up 6, 8, 10, 12 of FIG. 1. As here depicted, spot positions Sa, Sb and Sc are within the delimiting lines 21, 22; however, spot position Sd (highlighted using an arrow) crosses the line 21, and is thus out of specification. Using captured imagery from the camera 8 and image recognition software, the controller 12 can automatically recognize such an event by measuring the X-position of the spot S with respect to relevant features, such as the edge lines E1 and E2, and setting a flag if an excessive positional drift is detected. If such a flag is set, the acquired X-positional information for the spot S can be used by controller 12 to calculate a positional correction requited to bring spot S back into the region between the delimiting lines 21, 22, and this correction can be used to send a setpoint modification to the stage assembly 17. The result is a corrected spot position Se that is once again within tolerances.

As an alternative (or supplement) to adjusting a setpoint for the stage assembly 17, one could embody the projection system 11 to comprise at least one actuator-driven adjustable optical element that can be configured to steer the laser beam 7 in X/Y directions, and one could adjust the setpoint for this element, for example. Such optical element may include, for example, a lens element or a reflective optical element.

Embodiment 2

In the situation set forth above in Embodiment 1, a single laser beam 7 impinges upon the substrate 1. As an alternative, FIG. 4 illustrates a situation in which multiple laser beams impinge upon the substrate.

Figure 4:
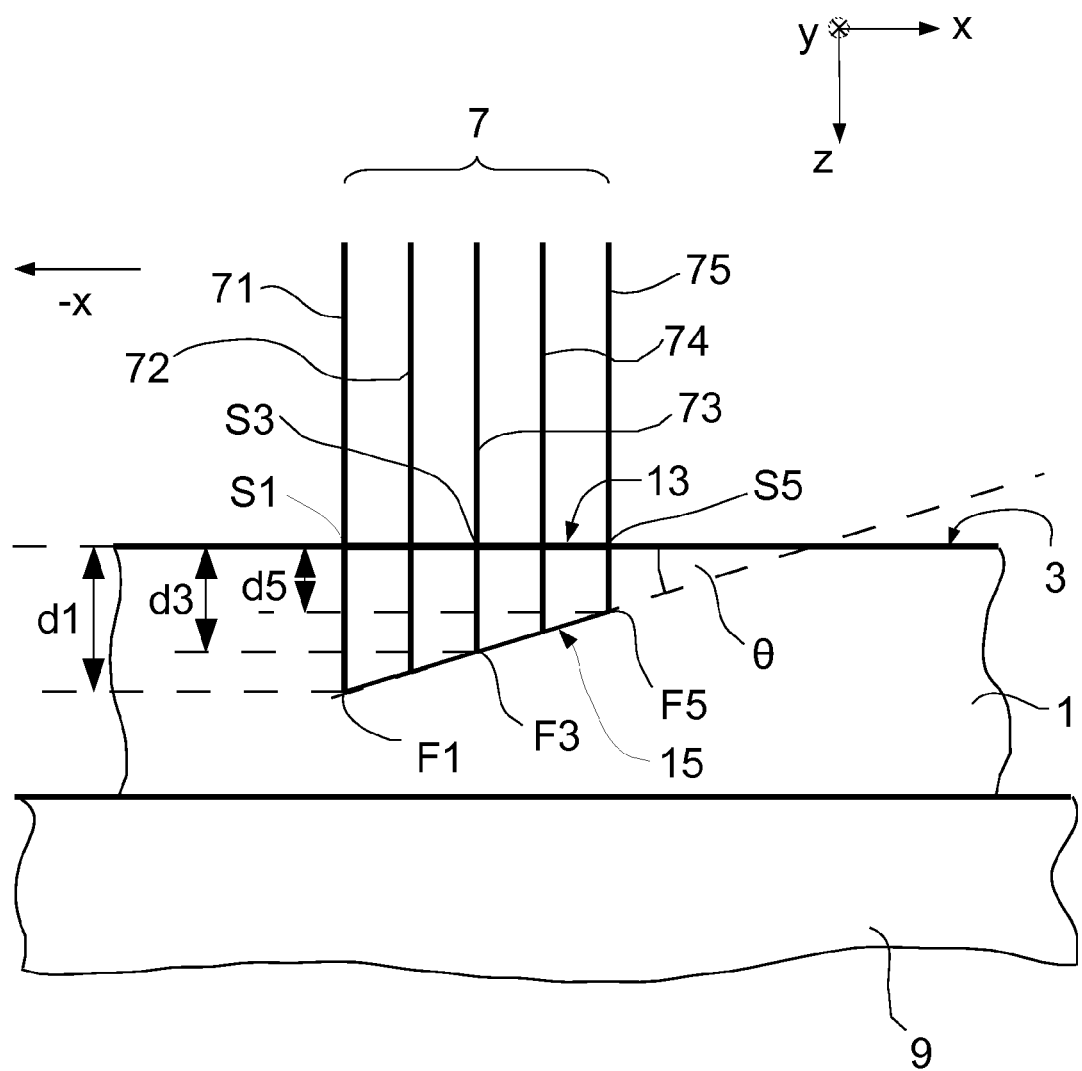
FIG. 4 renders a magnified elevational view (along a Y axis) of part of the subject of FIG. 1—in particular the lower region of FIG. 1—according to a specific embodiment.

To achieve the scenario depicted in FIG. 4, a beam dividing element (such as a Diffractive Optical Element) can be used to divide the beam 7 into a cluster of laser beams {71-75} that, in the current case, are separated from one another in the X direction (perpendicular to the plane of FIG. 1; parallel to the plane of FIG. 2). It should be noted that, for purposes of clarity, only the optical axis of each beam {71-75} is depicted, as otherwise FIG. 4 would be very cluttered; however, this (common) simplification will not impede the skilled artisan from understanding the structure and operation of the depicted set-up.

As here depicted, each of the beams {71-75} is focused to a sub-surface focal point {F1-F5} within a bulk of the substrate 1, the focal points {F1-F5} of adjacent beams {71-75} being located at different depths {d1-d5} below said major surface 3. Each of the beams {71-75} also produces a corresponding light spot {S1-S5} on the surface 3. Said spots {S1-S5} are disposed along a line 13, whereas said foci {F1-F5} are disposed along a line 15. As here depicted, the line 15 is a straight line that tilts below the line 13 at a downward pitch angle θ; however, this is not limiting, and the line 15 could instead be curved or wavy, for example. In a particular scenario, the following values apply:

The width of the beam cluster {71-75} in the X direction is 70 μm.

The depth-difference d1-d5 is 40 μm.

Accordingly, the pitch angle θ is arctan(40/70)=29.75°.

The shallowest focal point F5 is located 20 μm beneath exposed surface 3.

It should be noted that the line 15 need not be tilted with respect to the line 13; in an alternative set-up, lines 15 and 13 may be substantially parallel (i.e., θ≈0). It should also be noted that the line 15 could alternatively be located on the surface 3 rather than beneath it.

More information on such beam clusters can be gleaned, for example, from U.S. Pat. No. 7,968,432.

In the context of the current invention, the lateral position of the beam cluster {71-75} relative to a scribeline 2 on the surface 3 can be regulated by using captured imagery of one or more of the light spots {S1-S5} against (part of) the background 3, as desired/required in a particular situation.

Although the inventions has been described in detail for the purpose of illustration based on what is currently considered to be the most practical and preferred embodiments, it is to be understood that such detail is solely for that purpose and that the invention in not limited to the disclosed embodiments, but, on the contrary, is intended to cover modifications and equivalent arrangements that are within the spirit and scope of the described embodiments. For example, it is to be understood that the present invention contemplates that, to the extent possible, one or more features of any embodiment can be combined with one or more features of any other embodiment.

What is claimed is:

1. A method of scribing a substantially planar substrate comprising semiconductor material along at least one scribeline parallel to a major surface of the substrate, comprising:
    projecting a laser beam onto the major surface, a point of impingement of the beam constituting a light spot, the substrate being positioned with respect to the laser beam such that the light spot is disposed proximal to the scribeline;
    causing relative motion of the substrate with respect to the laser beam, such that the light spot is caused to translate substantially along the scribeline,
    whereby localized energy is transferred from the laser beam to the substrate along the course of the scribeline;
    monitoring a position of the light spot with respect to the scribeline by:
    illuminating at least a portion of the major surface proximal to the light spot using a flash of light, produced during the relative motion;
    capturing an image of the portion during the illumination and including the light spot, using an image recording device;
    analyzing the image and determining momentary position information for the light spot relative to the scribeline; and
    using the momentary position information to regulate a setpoint for a position of the laser beam relative to the substrate.

2. A method according to claim 1, wherein the laser beam is a pulsed laser beam and the image is at least partially captured during a radiating pulse of the laser beam.

3. A method according to claim 1, wherein, the flash of light comprises a wavelength different to that of the laser beam and the image recording device comprises a filter that substantially attenuates the wavelength of the laser beam but substantially transmits a wavelength of light from the flash of light reflected from the substrate.

4. A method according to claim 1, wherein the image recording device registers a location of the light spot with the aid of a localized glow generated by energetic interaction of the laser beam with at least one of: a material of the substrate, a fluid present at the location of the light spot, or combinations thereof.

5. A method according to claim 4, wherein the glow is generated proximal the light spot by a mechanism selected from the group comprising:
    localized incandescence of substrate material, due to heating thereof;
    localized luminescence of substrate material, due to recombination of electron-hole pairs generated therein;
    fluorescence in a locally generated plasma,
    and combinations thereof.

6. A method according to claim 3, wherein the image recording device registers a location of the light spot with the aid of a localized glow generated by energetic interaction of the laser beam with at least one of: a material of the substrate, a fluid present at the location of the light spot, or combinations thereof and wherein the filter transmits at least a portion of light from the glow.

7. A method according to claim 1, wherein:
    the laser beam is one member of a cluster of laser beams, all caused to concurrently impinge on the substrate at least proximal to the scribeline; and
    the light spot is at least one member of a corresponding cluster of light spots associated with the cluster of laser beams.

* * * * *